(12) United States Patent
Muramatsu et al.

(10) Patent No.: US 7,083,442 B2
(45) Date of Patent: Aug. 1, 2006

(54) PC CARD CONNECTOR ASSEMBLY

(75) Inventors: Hidenori Muramatsu, Kanagawa (JP); Katsumi Yamaguchi, Saitama (JP); Hiroshi Narita, Kanagawa (JP); Naoki Hiyama, Kanagawa (JP)

(73) Assignees: Tyco Electronics AMP K.K., Kanagawa-Ken (JP); OTAX Co. Ltd., Kanagawa-Ken (JP)

( * ) Notice: Subject to any disclaimer, the term of this patent is extended or adjusted under 35 U.S.C. 154(b) by 0 days.

(21) Appl. No.: 10/901,951

(22) Filed: Jul. 28, 2004

(65) Prior Publication Data

US 2005/0026485 A1 Feb. 3, 2005

(30) Foreign Application Priority Data

Jul. 28, 2003 (JP) ............. 2003-202255

(51) Int. Cl.
  *H01R 13/62* (2006.01)
(52) U.S. Cl. ..................... 439/156; 439/630
(58) Field of Classification Search ............. 439/159, 439/152–155, 160, 630, 541.1
  See application file for complete search history.

(56) References Cited

U.S. PATENT DOCUMENTS

| 5,644,839 | A | | 7/1997 | Stone | |
|---|---|---|---|---|---|
| 5,775,923 | A | | 7/1998 | Tomioka | |
| 6,120,322 | A | * | 9/2000 | Ho et al. | 439/541.5 |
| 6,238,240 | B1 | * | 5/2001 | Yu | 439/541.5 |
| 6,386,920 | B1 | * | 5/2002 | Sun | 439/630 |
| 6,390,855 | B1 | * | 5/2002 | Chang | 439/638 |
| 6,478,615 | B1 | | 11/2002 | Kuo | |
| 6,540,552 | B1 | | 4/2003 | Kuo | |
| 6,551,132 | B1 | | 4/2003 | Kuo | |
| 6,612,492 | B1 | * | 9/2003 | Yen | 235/451 |
| 6,716,066 | B1 | * | 4/2004 | Kuo | 439/630 |
| 6,783,399 | B1 | * | 8/2004 | Joung | 439/630 |
| 6,835,100 | B1 | * | 12/2004 | Chen | 439/630 |
| 2003/0114043 | A1 | | 6/2003 | Kuo | |

FOREIGN PATENT DOCUMENTS

JP   06-56992    4/1994
JP   2002-24769  1/2002

* cited by examiner

*Primary Examiner*—Tulsidas C. Patel
*Assistant Examiner*—Phuongchi Nguyen
(74) *Attorney, Agent, or Firm*—Barley Snyder LLC

(57) ABSTRACT

A PC card connector assembly which is capable of performing highly secure card connections, enables simultaneous use of a smart card, and is interchangeable with existing PC card connector assemblies. The PC card connector assembly includes an insulative housing having an opening, which is of dimensions that enable insertion of a plurality of PC cards. A planar smart card connecting unit partitions the opening in the vertical direction to form first and second cavities. The first cavity is designated as a PC card cavity, and the second cavity is designated as a smart card cavity. A plurality of first contacts are provided in the smart card connecting unit, for electrically contacting electrodes of the smart card received within the second cavity, while connected to second contacts.

19 Claims, 9 Drawing Sheets

PC CARD CONNECTOR ASSEMBLY

FIELD OF THE INVENTION

The present invention relates to a PC card connector assembly, which is utilized by personal computers and the like. More particularly, the present invention relates to a PC card connector assembly that accommodates a smart card along with a PC card.

BACKGROUND OF THE INVENTION

There are known double slotted PC card connector assemblies, which are utilized by personal computers and the like. For example, two card receiving slots are formed in the PC card connector assembly disclosed in Japanese Unexamined Utility Model Publication No. 6(1994)-56992, by vertically dividing a card receiving opening with a partition wall. Each of the two card receiving slots is configured to receive either a PCMCIA type I or a PCMCIA type II PC card therein. The partition wall may be removable. In the case that the partition wall is removed, a single slot with an expanded opening is formed. The single slot is configured to receive a PCMCIA type III PC card therein.

Smart cards are loadable in another known PC card connector assembly, as disclosed in Japanese Unexamined Patent Publication No. 2002-24769 (FIG. 5 and FIG. 6). This PC card connector assembly comprises a smart card reader, which is mounted within an existing PC card connector assembly, and is configured to receive either PC cards or smart cards.

Only PC cards are loadable in the PC card connector assemblies disclosed in Japanese Unexamined Utility Model Publication No. 6(1994)-56992 and in U.S. Pat. No. 5,775,923. That is, anyone may utilize data recorded in the PC cards by inserting them into the PC card assemblies.

However, in recent years, data stored in PC cards is being restricted to specific users, in order to improve the security aspects of data. As a method to ensure such secure use of data, combining the use of IC (integrated circuit) cards, that have IC chips for personal authentication thereon, along with PC cards, is being considered. Thereby, data recorded in a PC card is prevented from being read out, unless it is used as a set with a specific smart card. However, this method has a problem that a separate apparatus for reading the smart card becomes necessary. Alternatively, if a smart card reading apparatus is built into a computer, the size of the computer becomes large, and the mechanism thereof becomes complicated.

Japanese Unexamined Patent Publication No. 2002-24769 discloses a connector that is able to utilize smart cards therein. However, there is only a single card insertion slot, to be utilized with either a PC card or a smart card. Therefore, anyone can freely read out data from a PC card when it is inserted in this connector.

SUMMARY OF THE INVENTION

The present invention has been developed in view of the above points, and it is an object of the present invention to provide a PC card connector assembly which is capable of performing highly secure card connections.

It is another object of the present invention to provide a PC card connector assembly that enables simultaneous use of a smart card, and which is interchangeable with existing PC card connector assemblies.

The PC card connector assembly of the present invention comprises:

an insulative housing having an opening, which is of dimensions capable of receiving a plurality of PC cards therein;

an ejecting mechanism, for ejecting the PC cards; and a plurality of first contacts, which are mounted in the insulative housing, for electrically contacting the PC cards; wherein:

a smart card connecting unit, for vertically partitioning the opening, is provided to form a smart card cavity and a PC card cavity; and a plurality of second contacts provided in the smart card connecting unit, for electrically contacting electrodes of the smart card while also connecting with the first contacts.

Note that here, "PC cards" refer to memory cards that adhere to the PCMCIA standard, or to the JEIDA standard, which is a standard defined by the Japanese Electronic Industry Development Association, such as Type I, Type II, and Type III memory cards.

"Smart cards" refer to IC cards having IC chips, which include personal authentication data, embedded therein.

Personal authentication data stored in the smart card is read out, and the data stored in the PC card is made accessible to only specific users. By restricting users who are enabled to access data in this manner, highly secure card connections are enabled. In addition, the PC card connector assembly of the present invention can be produced at the same size as existing PC card connector assemblies. Thereby, a PC card connector assembly is provided that enables use of a smart card, and which is interchangeable with existing PC card connector assemblies.

BRIEF DESCRIPTION OF THE DRAWINGS

Exemplary embodiments of the invention will be described with reference to the accompanying drawings, of which:

FIGS. 8A, 8B, and 8C illustrate a frame of the PC card connector assembly of FIG. 1, wherein FIG. 8A is a plan view, FIG. 8B is a front view, and FIG. 8C is a side view;

FIGS. 9A and 9B illustrate a holder of the PC card connector assembly of FIG. 1, wherein: FIG. 9A is a plan view, and FIG. 9B is a front view;

FIGS. 10A, 10B and 10C illustrate the holder of the PC card connector assembly of FIG. 1, wherein: FIG. 10A is a left side view, FIG. 10B is a sectional view taken along line XB—XB of FIG. 9A, and FIG. 10C is a sectional view taken along line XC—XC of FIG. 9A;

FIGS. 11A and 11B illustrate a circuit board of a smart card connecting unit, wherein: FIG. 11A is a side view; and FIG. 11B is a plan view;

FIGS. 12A and 12B illustrate contacts, which are to be mounted on the circuit board of FIG. 11, according to an exemplary embodiment of the present invention, wherein: FIG. 12A is a plan view, and FIG. 12B is a side view; and FIGS. 13A, 13B, 13C, and 13D illustrate a unit connector according to an exemplary embodiment of the invention, which is utilized by the smart card connecting unit, wherein: FIG. 13A is a plan view, FIG. 13B is a front view, FIG. 13C is a side view, and FIG. 13D is a sectional view taken along line XIIID—XIIID of FIG. 13B.

DETAILED DESCRIPTION OF THE INVENTION

Hereinafter, a preferred embodiment of the PC card connector assembly (hereinafter, simply referred to as "assembly") of the present invention will be described in detail with reference to the attached drawings. Hereinafter, a description will be given with reference to FIG. 1 through FIG. 6.

The assembly 1 is mounted on a printed circuit board 22 (see FIG. 6), and comprises: an insulative housing 2 (hereinafter, simply referred to as "housing"); metallic frames 4, 6, and 8, which are mounted on the housing 2 (refer to FIG. 2 and FIG. 5); contacts 10 and 12 (first contacts, refer to FIG. 6); and an ejecting mechanism 14, for ejecting a PC card 26 and a smart card 32 (refer to FIG. 2 and FIG. 6).

Figure 3A:
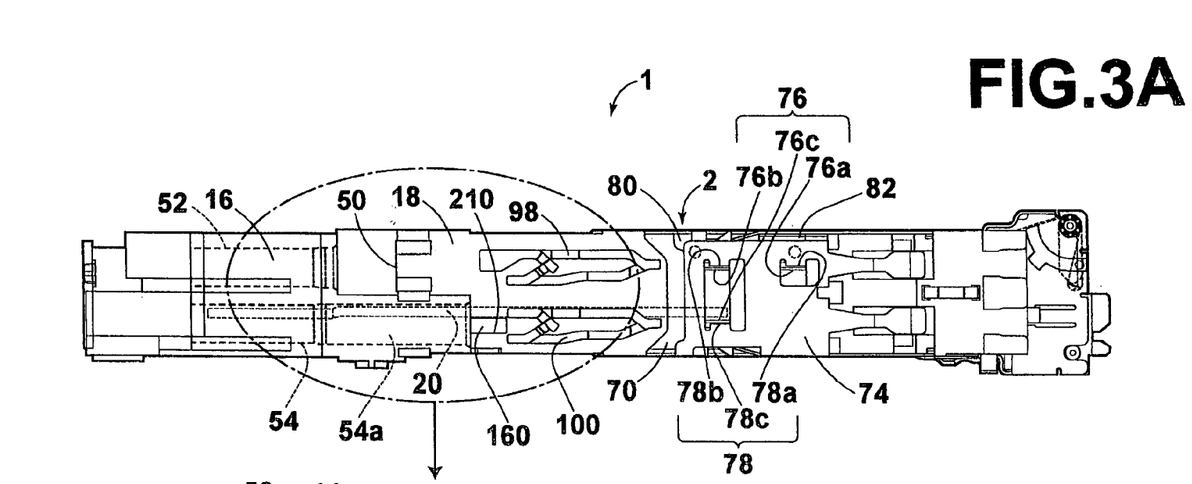
FIGS. 3A–3C are a left side views of the PC card connector assembly of FIG. 1, with FIGS. 3B and 3C being partial exploded views indicated in FIG. 3A showing portions of an insulative housing.
Figure 3B:
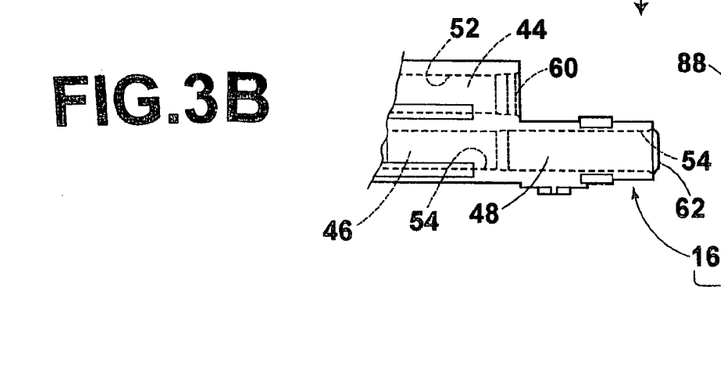

As illustrated in FIG. 3A, the housing 2 is constructed as a two piece structure, comprising: a main body 16 for holding the contacts 10 and 12 (refer to FIG. 6); and a card guide portion 18, which is linked to the main body 16. First, the main body 16 will be described. Two rows of contacts 10 are provided in the main body 16, along a circuit board 22 that the assembly 1 is to be mounted on.

A plurality of slots 24 (refer to FIG. 2) that extend in an insertion/ejection direction of the PC card 26 are provided in the upper surface of the main body 16. A grounding plate 30 is provided on the upper surface of the main body 16. The grounding plate 30 has a plurality of grounding tongue pieces 28 that are arranged within the slots 24. The grounding plate 30 establishes ground connections with protrusions 38, which are formed on a shielded exterior of the PC card 26, via the grounding tongue pieces 28 (refer to FIG. 6). The grounding plate 30 is fixed to the main body 16 by mounting pieces 40, which are positioned at both edges of the grounding plate 30. However, this is a common practice, therefore a detailed description thereof will be omitted. A plurality of tines 34 extend rearward from the grounding plate 30. The contacts 10, 12, and the tines 34 (refer to FIG. 6) are passed through through-holes (not shown) of a relay circuit board 36, which is provided behind the main body 16, and soldered (refer to FIG. 2 and FIG. 6). All of the contacts 10, 12 and the tines 34 are electrically connected to conductive pads (not shown), which are arranged at the lower edge of the relay circuit board 36, via conductive traces (not shown) thereof.

A conventional relay circuit board, as is typically employed in a conventional double slot PC card connector, may be utilized as the relay circuit board 36. Note that in FIG. 6, the PC card 26 is shown in a state in which it is connected to the contacts 10. Also, as illustrated in FIG. 6, a partitioning plate 42 is provided in the main body 16, for defining a cavity 44 for the PC card 26 and a cavity 46 for the smart card 32. The number of contacts 12 is small. Therefore, they are selectively connected to the through-holes of the conventional relay circuit board 36. A conventional relay connector 300, which is mounted to the same circuit board 22 as the assembly 1, and to which the relay circuit board 36 is connected, may be employed.

As illustrated in FIGS. 3A–3C and FIG. 7, extension portions 48 are formed at both sides of the main body 16. Note that FIG. 3A also includes a view of a mating portion 50 between the main body 16 and the card guide portion 18, in a state in which they are separated from each other. The extension portions 48 are aligned with the cavity 46 for smart cards 32, which is positioned below the cavity 44 for PC cards 26.

Guide grooves 52 are formed in both interior side surfaces of the cavity 44 for PC cards 26. Guide grooves 54 are formed in both interior side surfaces of the cavity 46 for smart cards 32. The guide grooves 54 are continuously formed in the interior surfaces of the extension portion 48.

Figure 7:
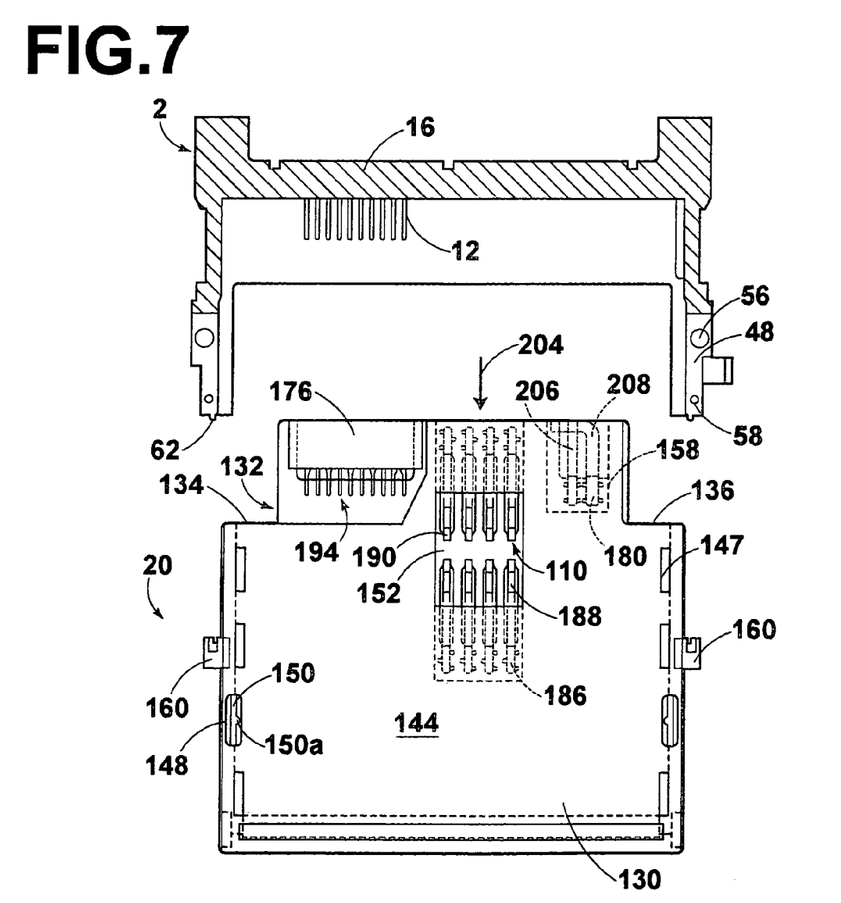
FIG. 7 is a plan view of a main body and a smart card connecting unit of the PC card connector assembly of FIG. 1, in which the main body is shown in partial cross section.

Here, a description will be given with reference to FIG. 7 as well. FIG. 7 is a plan view of the main body 16 and a smart card connecting unit 20 (hereinafter, simply referred to as "unit"). In FIG. 7, portions of the main body 16 are illustrated in cross section. Mounting apertures 56 and small apertures 58, all of which are perpendicular to the circuit board 22, are provided in the extension portions 48. Screws (not shown), for mounting the assembly 1 to the circuit board 22, are inserted through the mounting apertures 56. Links 96, which are C-shaped in cross section (refer to FIG. 2), for linking the main body 16 and the card guide portion 18 together are inserted through the small apertures 58. Vertical grooves 60 are formed at the front ends of the two guide grooves 52 of the main body. Vertically extending ribs 62 are formed at the front ends of the two guide grooves 54 of the main body 16 (refer to FIG. 3A).

Next, the card guide portion 18, which is linked to the main body 16, will be described. The card guide portion 18 comprises guide halves 70 and 72, which are substantially symmetrical (refer to FIG. 2). The guide halves 70 and 72 are held integrally and parallel to each other by a frame 4 (refer to FIG. 2) and a frame 6 (the hatched portion in FIG. 5), which are provided above and below the guide halves 70 and 72, respectively.

The relationships among the guide halves 70 and 72 and the frames 4 and 6 will be described in further detail. The lower frame 6 comprises walls 74 and 74 (refer to FIG. 3A), which are erected by bending two edges of the frame 6. The walls 74 are positioned toward the exterior of the guide halves 70 and 72. Inwardly facing claws 78 (78a, 78b, and 78c) of the walls 74 engage slots 76 (76a, 76b, and 76c), which are provided in the guide halves 70 and 72. Protrusions 80 and 82 (refer to FIG. 3A) that extend downward from the frame 4 toward the walls 74 are fixed to the interior surfaces of the walls 74 by welding. In addition, claws 86 of the frame 4 engage slots 84 of the guide haves 70 and 72 (refer to FIG. 2). The card guide portion 18, assembled by integrating the guide halves 70 and 72 and the frames 4 and 6 in the manner described above, is united with the main body 16, as illustrated in FIG. 3A.

The end of the card guide portion 18 is substantially complementary with the end of the main body 16. Ribs 88 and grooves 90 are provided at the end of the card guide portion 18. Grooves 60 and ribs 62 are provided at the end of the main body 16. The ribs 88 engage the grooves 60, and the grooves 90 engage with the ribs 62. In addition, mounting apertures 92 and small apertures 94, corresponding to the mounting apertures 56 and the small apertures 58 respectively, are formed in the card guide portion 18. The card guide portion 18 and the main body 16 are united and fixed to each other by press fitting the C-shaped links 96 into the small apertures 58 and 94, which are aligned with each other. When the card guide portion 18 and the main body 16 are united, the unit 20 is interposed between the cavities 44 and 46. The interposition of the unit 20 will be described later. The frame 8 is mounted so as to straddle the card guide portion 18 and the main body 16. The frame 8 will be described in detail later.

Figure 3C:
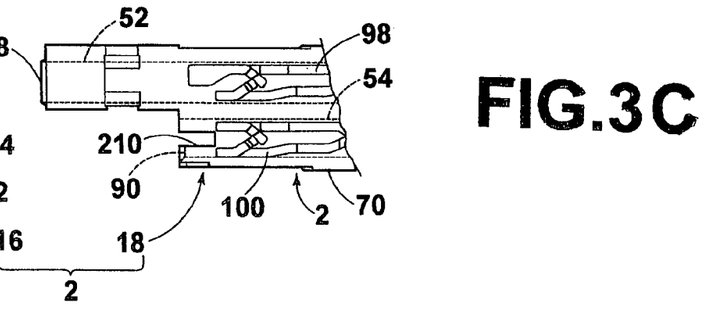
Figure 4:
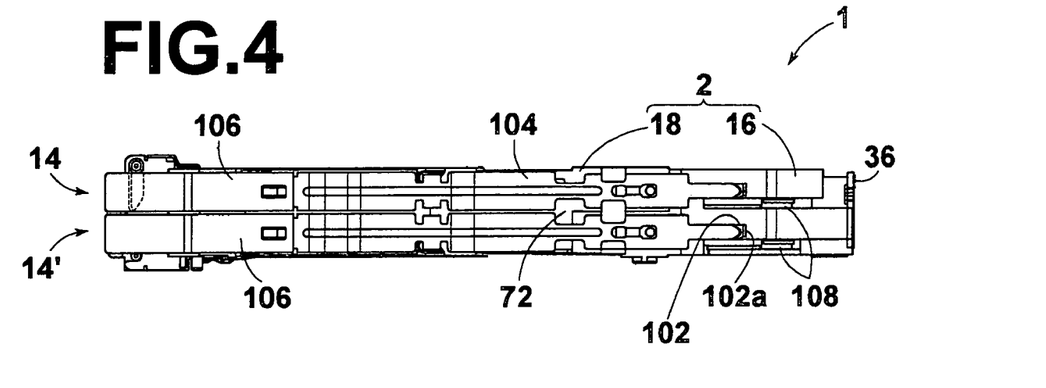
FIG. 4 is a right side view of the PC card connector assembly of FIG. 1.
Figure 5:
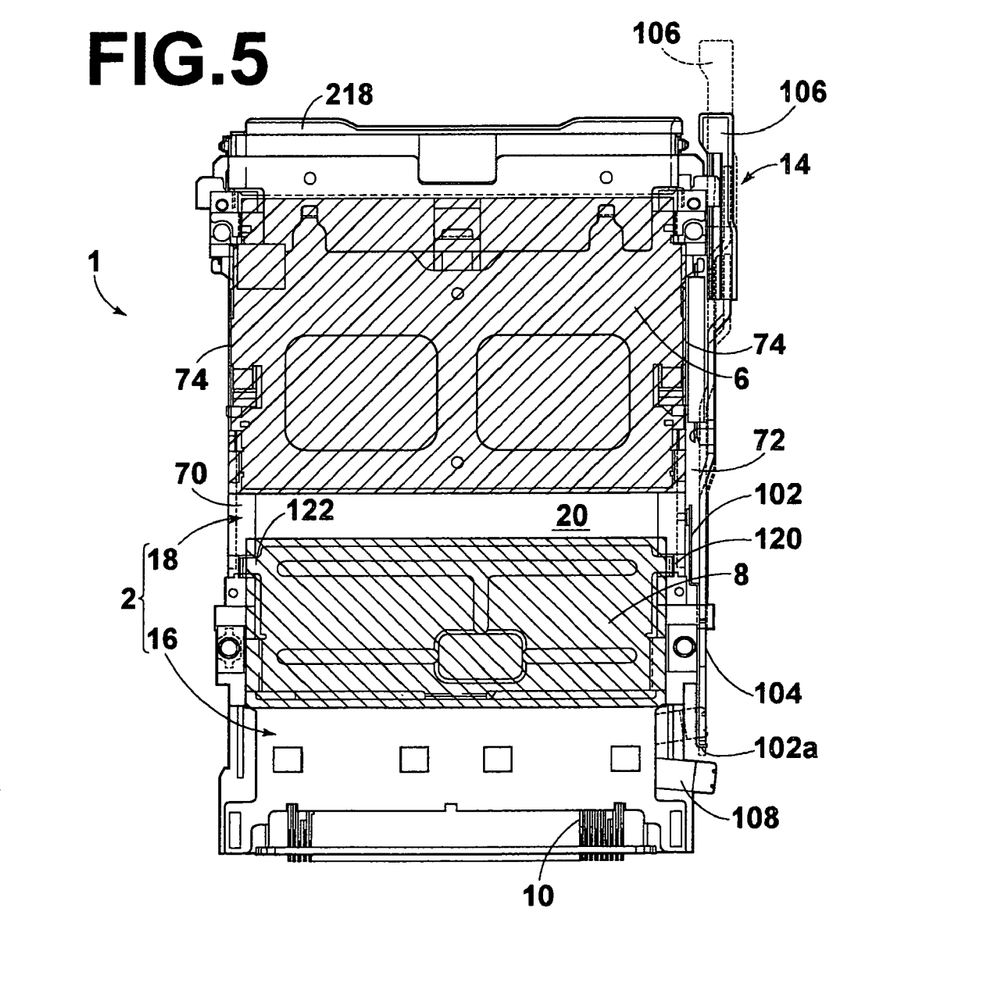
FIG. 5 is a bottom view of the PC card connector assembly of FIG. 1.

Guide groves 52 and 54, which are continuous with the aforementioned guide groove 52 and 54, are formed in the card guide portion 18 (refer to FIGS. 3A and 3C). Two ejecting mechanisms 14 and 14', for the PC card 26 and the smart card 32, respectively, are mounted on both side surfaces of the card guide portion 18 and the main body 16. The ejecting mechanisms 14 and 14' are both ejecting mechanisms of the so-called "push/push type", comprising heart shaped cam grooves 98 and 100, respectively. This type of ejecting mechanism is similar to that which is disclosed in, for example, Japanese Unexamined Patent Publication No. 2001-291553. Because this mechanism is of a known structure, a detailed description thereof will be omitted, and only a simple description will be given hereinafter.

Note that because the ejecting mechanisms 14 and 14' are of the same structure, only the ejecting mechanism 14 will be described. The ejecting mechanism 14 comprises: heart shaped cam grooves 98, which are formed in the exterior surfaces of the guide halves 70 and 72 (refer to FIG. 3A); cam followers 102, which move within the cam grooves 98 (refer to FIG. 2, FIG. 4, and FIG. 5); ejecting bars 104 that rotatably support the cam followers 102; and knobs 106, formed of resin, which are mounted to the ejecting bars 104 toward the card insertion side thereof.

The ejecting mechanism 14 is configured to be mountable on either the right or left side of the card guide portion 18, depending on the application thereof. The tips 102a of the cam followers 102 protrude from the tips of the ejecting bars 104. The tips 102a are configured to press the ends of ejecting arms 108, which are provided to eject the PC card 26, and cause the ejecting arms 108 to swing. Thereby, pressing ends 108b (refer to FIG. 6), which are positioned within the cavity 44, of the ejecting arms 108 press the front end 26a of the PC card 26 in the ejection direction. The cam followers 102 move to circulate within the cam grooves 98 each time that the knobs 106 are pressed. Thereby, the ejecting arms 108 are pressed, the ejecting bars 104 are held in a depressed position, or the ejecting bars 104 are caused to protrude.

Figure 8A:
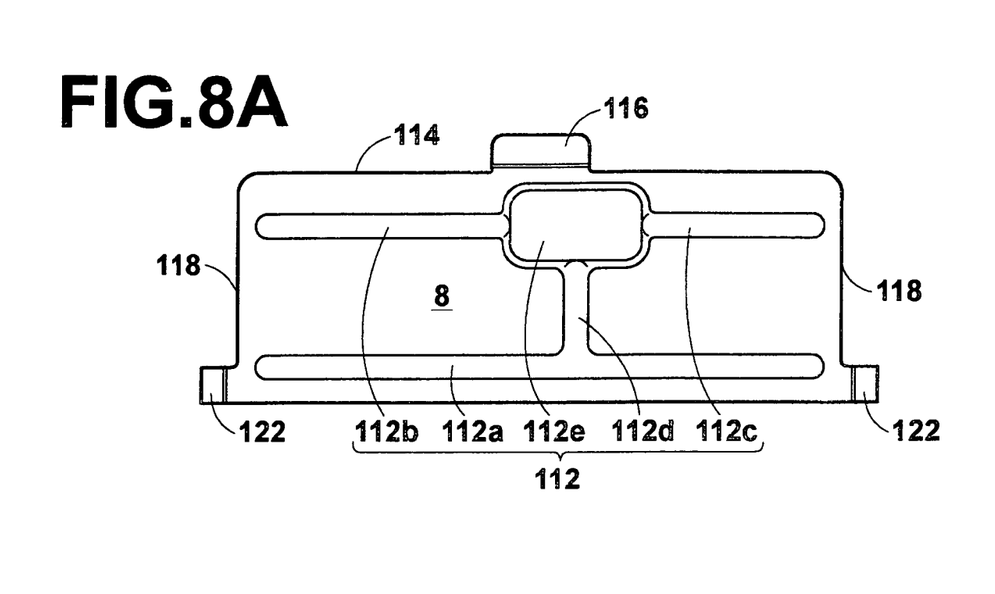
Figure 8B:
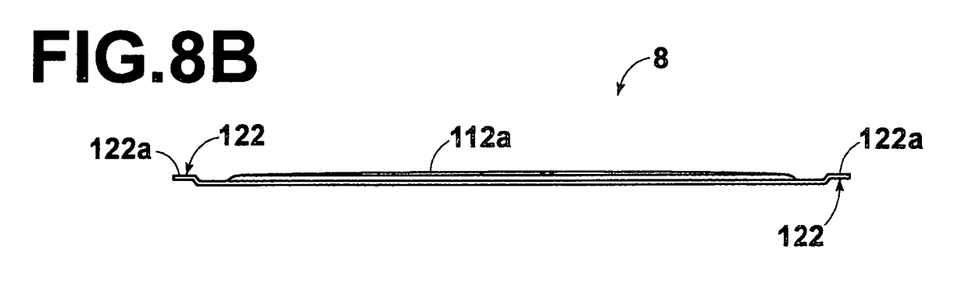
Figure 8C:
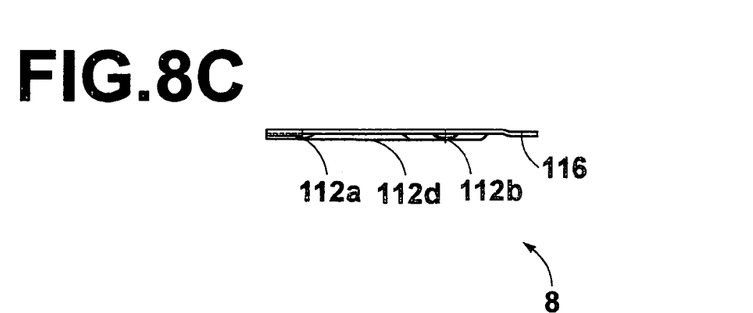

Next, the frame 8 will be described with combined reference to FIGS. 8A, 8B, and 8C. FIGS. 8A, 8B, and 8C illustrate the frame 8, wherein FIG. 8A is a plan view, FIG. 8B is a front view, and FIG. 8C is a side view. The frame 8 is provided at a position that corresponds to contacts 110 (second contacts) of the unit 20, which will be described later. The frame 8 is rectangular and may be formed from a metal plate. The frame 8 comprises a plurality of beads 112 (112a, 112b, 112c, 112d, and 112e). The beads 112 are formed so that each of the beads 112a, 112b, 112c, 112d, and 112e protrude at the same height within the cavity 46 for smart cards 32.

A tongue piece 116 protrudes an the edge 114 of the frame 8, and tongue pieces 122, which are positioned within recesses 120 of the card guide portion 18, are formed at the corners of edges 118 of the frame 8, furthest from the tongue piece 116. The tongue pieces 122 are formed in an L-shape, and comprise upwardly facing upper surfaces 122a. The tongue pieces 116 and 122 function as mounting portions for mounting the frame 8 to the housing 2. The upper surfaces 122a of the tongue pieces 122 also serve as support surfaces for supporting the unit 20. Accordingly, when the unit 20, which is to be a partition wall, is mounted to the housing 2, the upper surfaces 122a holds the unit 20 at a predetermined height within the guide grooves 54. Thereby, guide grooves 54a, which are narrower than the guide grooves 54 and into which the smart card 32 may be inserted, are defined by the lower surface of the unit 20 and the lower surfaces of the guide grooves 54.

Next, the unit 20 will be described with reference to FIG. 7. As illustrated in FIG. 7, the unit 20 is generally planar in shape. A circuit board 132 is mounted onto a planar holder 130. When the unit 20 is mounted onto the housing 2, the unit 20 functions as a partition wall that defines the cavity 44 and the cavity 46, as previously described. First, the holder 130 will be described, with reference to FIGS. 9A, 9B, 10A, 10B, and 10C.

Figure 9A:
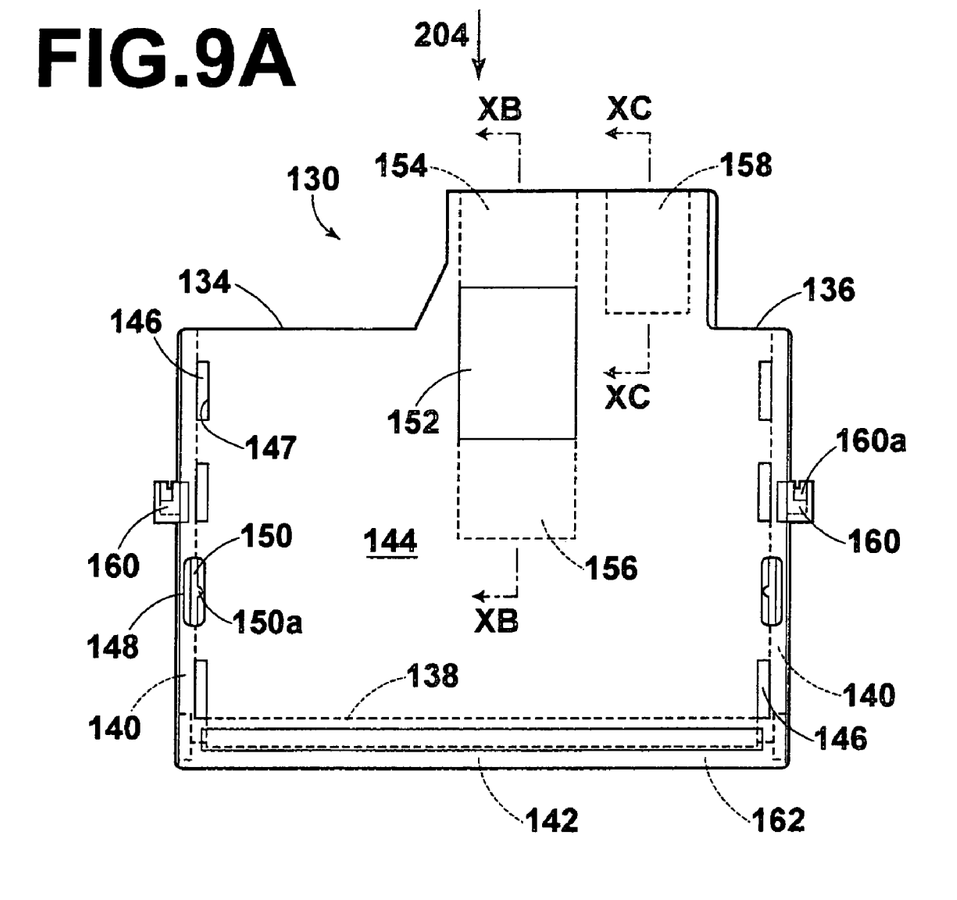
Figure 9B:
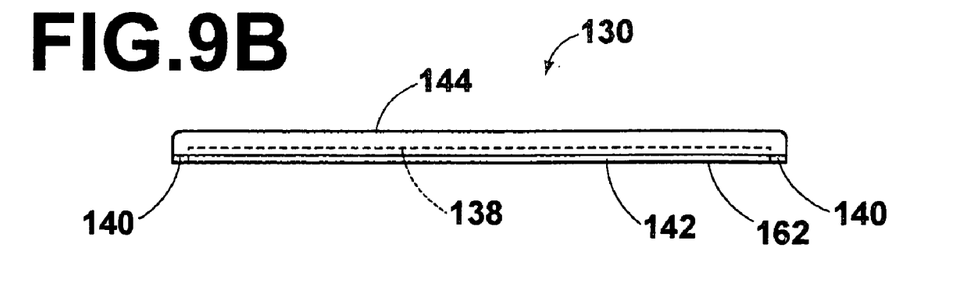
Figure 10A:
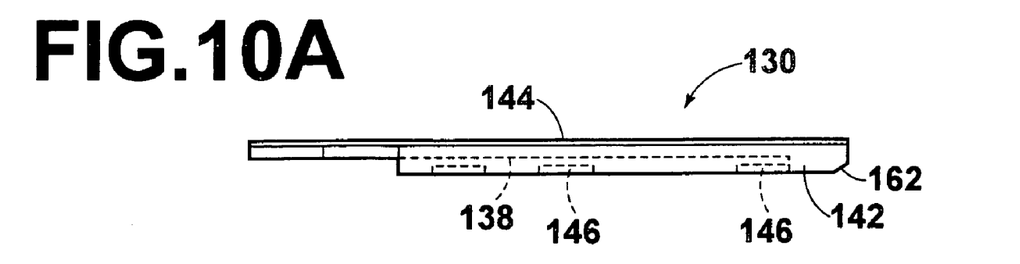
Figure 10B:
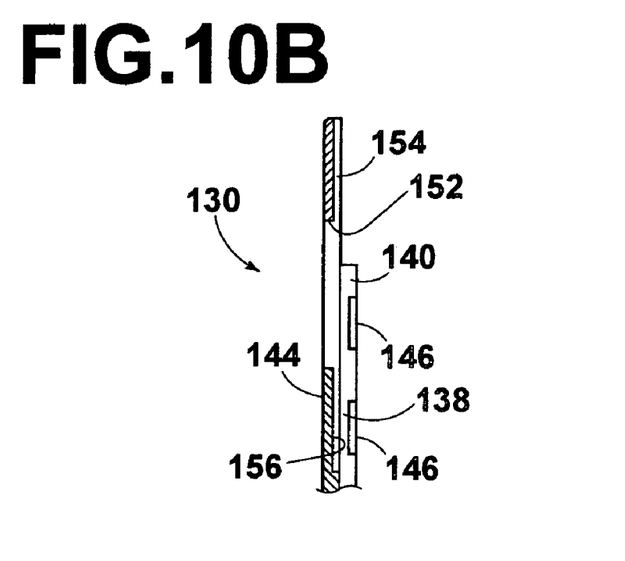
Figure 10C:
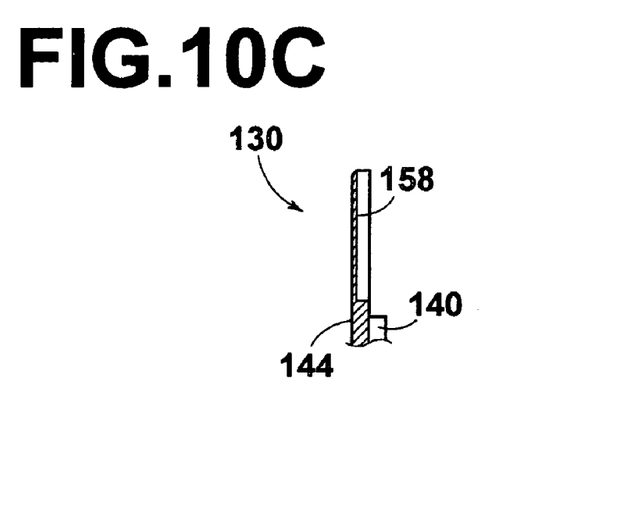

FIGS. 9A, 9B, 10A, 10B, and 10C illustrate the holder 130, wherein: FIG. 9A is a plan view, FIG. 9B is a front view, FIG. 10A is a left side view, FIG. 10B is a sectional view taken along line XB—XB of FIG. 9A, and FIG. 10C is a sectional view taken along line XC—XC of FIG. 9A. The holder 130 is formed of resin, and has cutouts 134 and 136 on the side thereof toward the main body 16. The holder 130 also has a recess 138, which is defined by parallel side walls 140, 140, and an end wall 142, for housing the circuit board 132.

A plurality of ribs 146 are formed along the side walls 140 on an upper wall 144 of the holder 130. Openings 147 are provided to form the ribs 146. Slots 148 are formed in the side walls 140 at both sides of the upper wall 144, and engaging pieces 150 are formed within the slots 148. The engaging pieces 150 are of a simple beam structure. Inwardly protruding protrusions 150a are formed on the engaging pieces 150.

A rectangular opening 152 is formed in the upper wall 144, where the contacts 110 are positioned as will be described later. Thin walled portions 154 and 156 are formed adjacent to the opening 152 in the card insertion/ejection direction. A similar thin walled portion 158 is formed adjacent to the thin walled portion 154. Ears (protrusions) 160, 160 are formed in the vicinity of the centers of the side walls 140. Grooves 160a, for receiving the tongue pieces 122 of the frame 8, are formed in the ears 160. A taper 162, for guiding the smart card 32 during insertion thereof, is formed at the lower edge of the end wall 142.

Figure 11A:
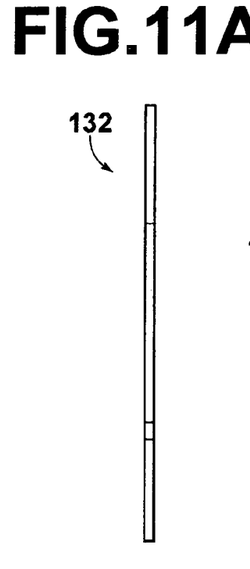
Figure 11B:
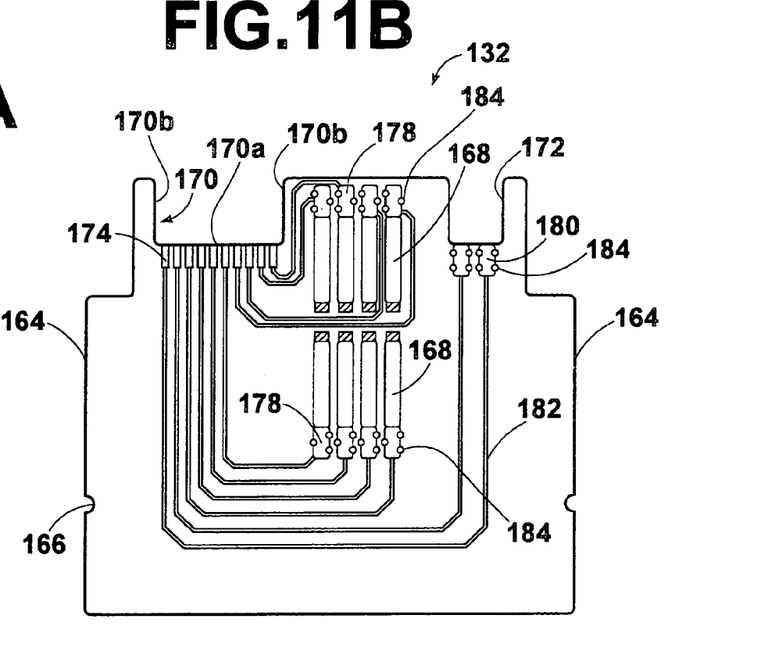
Figure 12A:
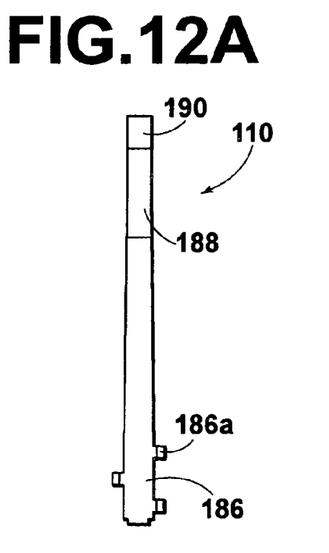
Figure 12B:
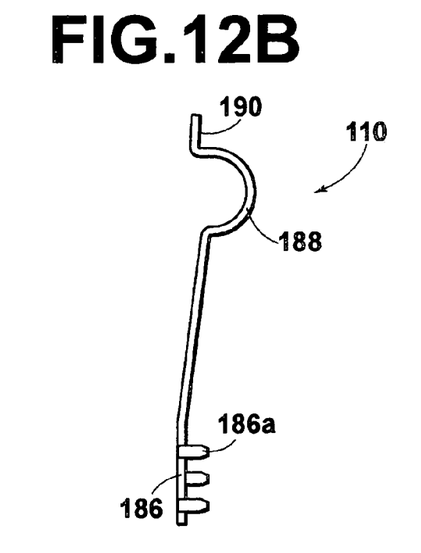

Next, the circuit board 132, which is mounted on the holder 130, will be described with reference to FIGS. 11A, 11B, 12A, and 12B. FIGS. 11A and 11B illustrate the circuit board 132, wherein: FIG. 11A is a side view; and FIG. 11B is a plan view. FIGS. 12A and 12B illustrate the contacts 110 (second contacts), which are to be mounted on the circuit board 132, wherein: FIG. 12A is a plan view, and FIG. 12B is a side view. The circuit board 132 has outer dimensions that enable it to be housed within the recess 138 of the holder 130. Cutouts 166 are formed in the side edges 164 of the circuit board 132, at positions corresponding to the aforementioned protrusions 150a. The cutouts 166 engage with the protrusions 150a, to position the circuit board 132 when it is inserted into the holder 130.

Elongate slots 168 that extend in the insertion/ejection direction of the PC card 26 and the smart card 32 are formed in two rows of four slots each in the circuit board 132, at a position corresponding to the opening 152 of the holder 130.

Conductive pads 178 are formed at the exterior of each of the slots 168. A cutout 170 is formed at a position corresponding to the aforementioned cutout 134, and a cutout 172 is formed at a position corresponding to the thin walled portion 158. Conductive pads 174 are provided on an edge 170a of the cutout 170 at predetermined intervals. A unit connector 176 (refer to FIG. 13), to be described later, is to be mounted within the cutout 170. Two conductive pads 180 are formed at an edge of the cutout 172. The conductive pads 178 and 180 are electrically connected to the conductive pads 174 via conductive traces 182, which are formed on the circuit board 132. Extremely fine apertures 184 are formed through the conductive pads 178 and 180.

Next, the contacts 110, which are arranged within the slots 168, will be described with reference to FIG. 12. The contacts 110 are formed by punching and bending elongate plates from a single metallic plate. Each contact 110 comprises: a mounting portion 186, which is soldered to the conductive pads 178; and a curved contact portion 188, for contacting electrodes 33 of the smart card 32 (refer to FIG. 6). Protrusions 186a, which are inserted into the extremely fine apertures 184 to position the contacts 110, are formed on the mounting portion 186. A tongue piece 190 is formed on the tip of the contact portion 188. The tongue piece 190 abuts an edge of the slot 168 opposite that of the conductive pad 178.

Figure 13A:
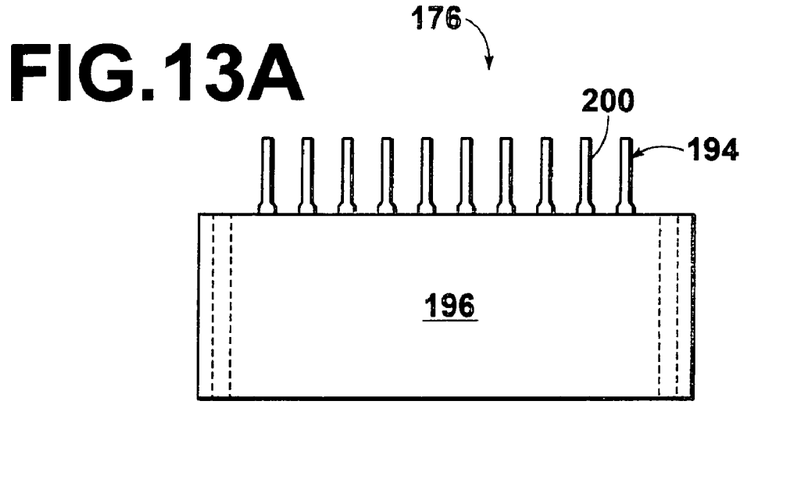
Figure 13B:
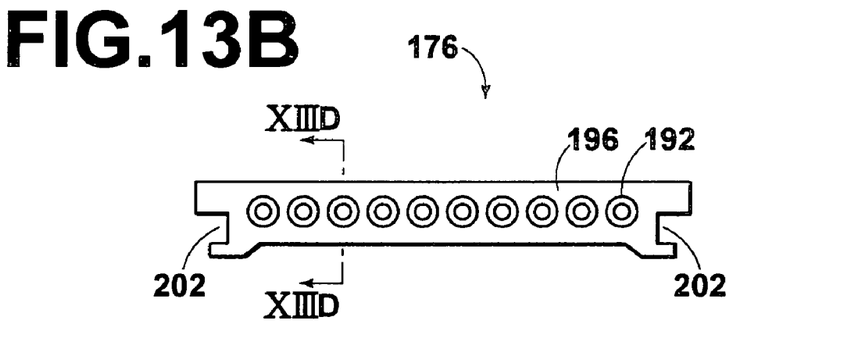
Figure 13C:
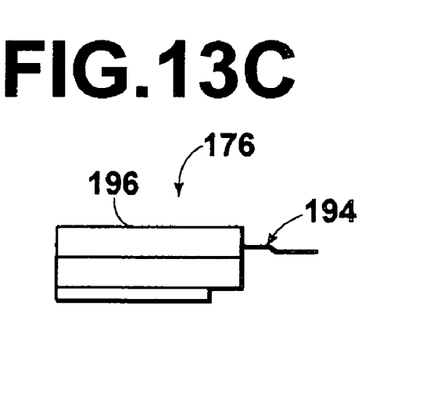
Figure 13D:
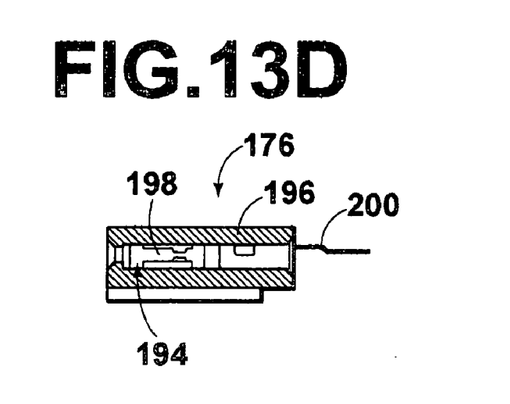

Next, the unit connector 176, which is mounted onto the circuit board 132 of the unit 20, will be described with reference to FIGS. 13A, 13B, 13C, and 13D. FIGS. 13A, 13B, 13C, and 13D illustrate the unit connector 176, wherein: FIG. 13A is a plan view, FIG. 13B is a front view, FIG. 13C is a side view, and FIG. 13D is a sectional view taken along line XIIID—XIIID of FIG. 13B. The unit connector 176 has a planar insulative housing 196 (hereinafter, simply referred to as "housing"). A row of contact cavities 192 is provided within the housing 196. A terminal 194 is provided in each of the contact cavities 192.

Each of the terminals 194 comprises: a contact portion 198, which is connected to the contacts 12; and a tine 200, which is soldered to the conductive pads 174 (refer to FIG. 13D). Grooves 202 are formed at both ends of the housing 196 to receive side edges 170b of the cutout 170 (refer to FIG. 11B). The circuit board 132, to which the unit connector 176 and the contacts 110 have been mounted, is inserted into the recess 138 of the holder 130 from the direction indicated by arrow 204 (refer to FIG. 9A), and welded thereto by ultrasonic welding or the like. At this time, the contacts 110 are positioned between the holder 130 and the circuit board 132, and the contact portions 188 of the contacts 110 protrude toward the rear surface of the drawing sheet of FIG. 7.

A pair of contacts 206 and 208 are attached to the conductive pads 180, as illustrated in FIG. 7. The contact points of the contacts 206 and 208 are separated from each other. The contacts 206 and 208 detect whether the smart card 32 has been inserted. The detection of the smart card 32 is performed by the substantially L-shaped contact 208 being pressed toward the contact 206 by the smart card 32 to contact therewith. The smart card 32 is detected by the electrical connection between the contacts 206 and 208.

Figure 6:
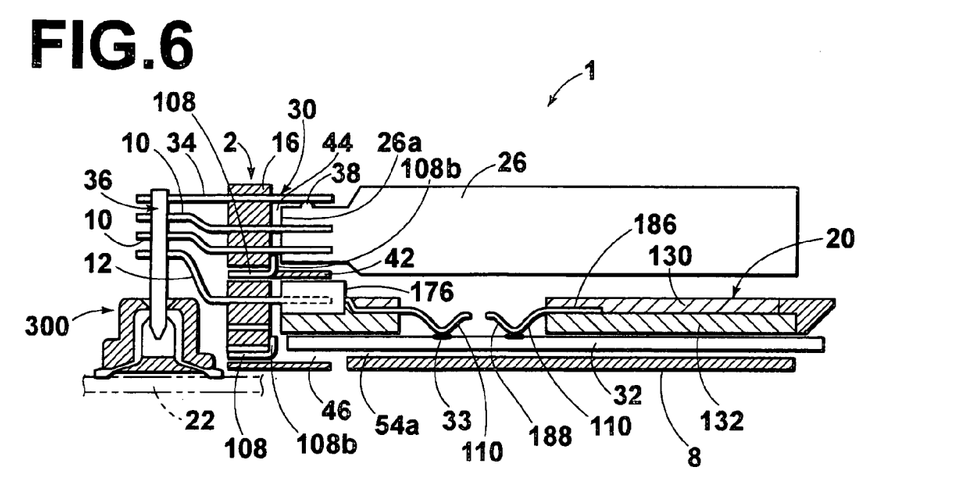
FIG. 6 is a sectional view of the PC card connector assembly of FIG. 1.

When the smart card connecting unit 20, constructed as described above, is mounted to the housing 2, the unit connector 176 engages with the contacts 12, and is arranged as illustrated in FIG. 6. FIG. 6 illustrates a state in which the contacts 110 are in contact with the electrodes 33 of the smart card 32. At this time, the ears 160 of the smart card connecting unit 20 are positioned in the cutouts 210, which are adjacent to the mating portion 50 of the card guide portion 18, as illustrated in FIG. 3A. The card guide portion 18 cooperates with the main body 16 to fix the smart card connecting unit 20 and to prevent extraction thereof.

The tongue pieces 122 of the frame 8 are received within the grooves 160a of the ears 160. Therefore, the frame 8 is fixed to the housing 2 along with the smart card connecting unit 20. When the smart card 32 is inserted into the cavity 46, the smart card 32 is pressed downward by the contact pressure between the contacts 110 and the electrodes 33. The beads 112 of the frame 8 support this downward force.

Figure 1:
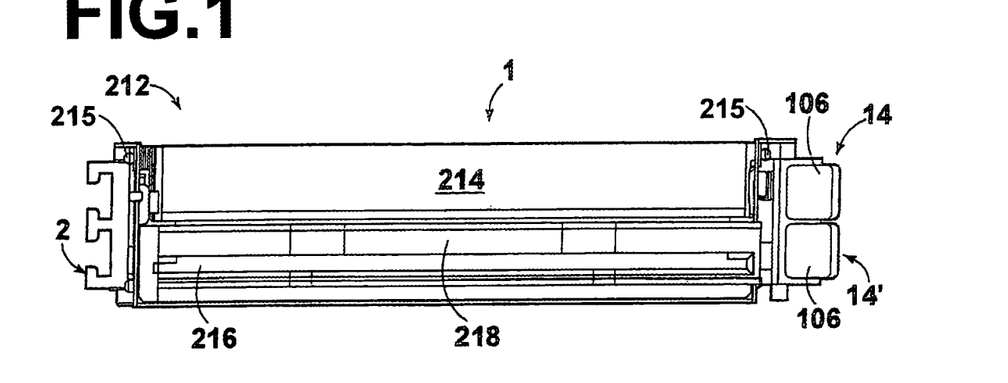
FIG. 1 is a front view of a PC card connector assembly according to an exemplary embodiment of the present invention.
Figure 2:
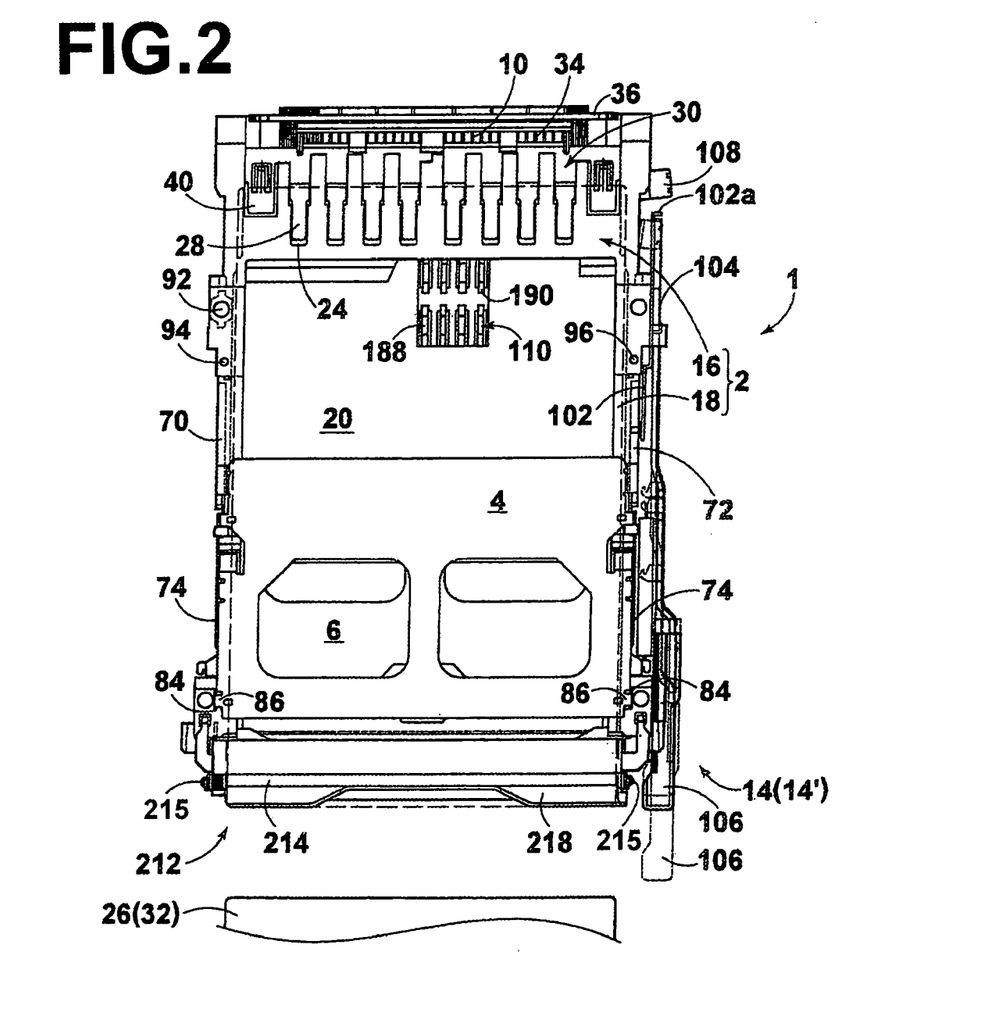
FIG. 2 is a plan view of the PC card connector assembly of FIG. 1.

As illustrated in FIG. 1 and FIG. 2, a shutter 214 that rotates during insertion of the PC card 26 is attached to a card receiving opening 212 of the assembly 1. The shutter 214 rotates about shafts 215, which are provided at both ends of the shutter 214, when the PC card 26 presses it during insertion thereof. The rotation enables the opening 212 to open, thereby allowing insertion of the PC card 26. An entry member 218 is attached to the lower portion of the shutter 214. The entry member 218 has a slot 216 for the smart card 32 to be inserted through. The smart card 32 is inserted into the cavity 46 through the slot 216.

We claim:

1. A PC card connector assembly, comprising:
   an insulative housing having an opening of dimensions for receiving two PC cards therein;
   an ejecting mechanism for ejecting the PC cards; and
   a plurality of first contacts mounted in the insulative housing configured for electrically contacting the PC cards;
   a smart card connecting unit, vertically partitioning the opening to form two cavities, one of the cavities being a smart card receiving cavity and another of the cavities being a PC card receiving cavity; and
   a plurality of second contacts provided in the smart card connecting unit configured for electrically contacting electrodes of a smart card received in the smart card receiving cavity while also electrically connecting with the first contacts in the smart card receiving cavity.

2. A PC card connector assembly as defined in claim 1, wherein the insulative housing comprises a main body that houses the first contacts and a card guide portion, which is linked to the main body, for guiding the PC cards, the smart card connecting unit being held cooperatively by the main body and the card guide portion.

3. A PC card connector assembly as defined in claim 2, wherein a protrusion that protrudes toward the card guide portion is provided on the smart card connecting unit and the protrusion is held between the main body and the card guide portion.

4. A PC card connector assembly as defined in claim 3, wherein the smart card connecting unit comprises a unit connector, terminals are provided within the unit connector and the electrical connections with the first contacts are performed via the unit connector.

5. A PC card connector assembly as defined in claim 3, wherein the card guide portion is linked to the main body and comprises substantially symmetrical guide halves, which are held integrally and parallel to each other by frames, which are provided above and below the guide halves.

6. A PC card connector assembly, comprising:
   a insulative housing having a PC card receiving cavity and a smart card receiving cavity;
   first contacts mounted to the insulating housing, each of the first contacts having a first end electrically connected to a circuit board and a second end extending into either the PC card receiving cavity or the smart card receiving cavity;

a smart card connecting unit mounted in the insulating housing, the PC card receiving cavity and the smart card receiving cavity being separated by the smart card connecting unit; and second contacts mounted to the smart card connecting unit, each of the second contacts having a first end electrically connected to the first contacts that extend into the smart card receiving cavity and a second end configured for contacting a smart card inserted into the smart card reciving cavity.

7. The PC card connector assembly as defined in claim 6, wherein the second end of the second contacts are curved.

8. The PC card connector assembly as defined in claim 6, further comprising a smart card detection mechanism for detecting when the smart card is inserted into the smart card receiving cavity, the smart card detction mechanism being provided on the smart card connecting unit.

9. The PC card connector assembly as defined in claim 6, further comprising a card ejecting mechanism mounted on the insulative housing.

10. The PC card connector assembly as defined in claim 6, further comprising a card guide portion mounted to the insulative housing.

11. The PC card connector assembly as defined in claim 6, wherein the smart card connecting unit includes a second circuit board having a plurality of traces that electrically connect the second contacts to the first contacts.

12. The PC card connector assembly as defined in claim 11, further comprising a unit connector mounted on the second circuit board having a plurality of terminals that electrically connect the second contacts to the first contacts.

13. A PC card connector assembly, comprising:
an insulative housing including a main body and a card guide portion;
a smart card connecting unit being held cooperatively by the main body and the card guide portion in the insulative housing, the smart card connecting unit partitioning the insulating housing into a PC card receiving cavity and a smart card receiving cavity;
first contacts housed in the main body that extend into into the PC card receiving cavity and the smart card receiving cavity; and
second contacts mounted to the smart card connecting unit, each of the second contacts having a first end electrically connected to the first contacts that extend into the smart card receiving cavity and a second end configured for contacting a smart card inserted into the smart card reciving cavity.

14. The PC card connector assembly as defined in claim 13, further comprising a smart card detection mechanism for detecting when the smart card is inserted into the smart card receiving cavity, the smart card detction mechanism being provided on the smart card connecting unit.

15. The PC card connector assembly as defined in claim 13, further comprising a card ejecting mechanism mounted on the insulative housing.

16. The PC card connector assembly as defined in claim 13, further comprising a protrusion extending from the smart card connecting unit that is held between the main body and the guide portion.

17. A PC card connector assembly as defined in claim 13, wherein the card guide portion includes substantially symmetrical guide halves held integrally and parallel to each other by frames provided above and below the guide halves.

18. The PC card connector assembly as defined in claim 13, wherein the smart card connecting unit includes a second circuit board having a plurality of traces that electrically connect the second contacts to the first contacts.

19. The PC card connector assembly as defined in claim 18, further comprising a unit connector mounted on the second circuit board having a plurality of terminals that electrically connect the second contacts to the first contacts.

* * * * *

UNITED STATES PATENT AND TRADEMARK OFFICE
CERTIFICATE OF CORRECTION

PATENT NO. : 7,083,442 B2
APPLICATION NO. : 10/901951
DATED : August 1, 2006
INVENTOR(S) : Muramatsu et al.

Page 1 of 1

It is certified that error appears in the above-identified patent and that said Letters Patent is hereby corrected as shown below:

In column 3, line 53 "circuit board 36, which is provided behind the main body 16," should read --circuit board 16, which is provided behind the main body 36, --

In column 9, line 13 after "smart card" delete "reciving" and insert --receiving--

In column 9, line 19 after "smart card" delete "detction" and insert --detection--

In column 10, line 4 after "extend" delete "into"

In column 10, line 12 after "smart card" delete "reciving" and insert --receiving--

In column 10, line 16 after "smart card" delete "detction" and insert --detection--

Signed and Sealed this

Nineteenth Day of December, 2006

JON W. DUDAS
*Director of the United States Patent and Trademark Office*

UNITED STATES PATENT AND TRADEMARK OFFICE
CERTIFICATE OF CORRECTION

PATENT NO. : 7,083,442 B2  Page 1 of 1
APPLICATION NO. : 10/901951
DATED : August 1, 2006
INVENTOR(S) : Muramatsu et al.

It is certified that error appears in the above-identified patent and that said Letters Patent is hereby corrected as shown below:

In column 3, line 53 "circuit board 36, which is provided behind the main body 16", should read --circuit board 16, which is provided behind the main body 36, --

In column 9, line 13 after "smart card" delete "reciving" and insert --receiving--

In column 9, line 19 after "smart card" delete "detction" and insert --detection--

In column 10, line 4 after "extend" delete "into"

In column 10, line 12 after "smart card" delete "reciving" and insert --receiving--

In column 10, line 16 after "smart card" delete "detction" and insert --detection--

Signed and Sealed this

Ninth Day of January, 2007

JON W. DUDAS
*Director of the United States Patent and Trademark Office*